United States Patent

Ichino et al.

[11] Patent Number: 6,071,016
[45] Date of Patent: Jun. 6, 2000

[54] LIGHT RECEIVING MODULE FOR OPTICAL COMMUNICATION AND LIGHT RECEIVING UNIT THEREOF

[75] Inventors: Haruhiko Ichino; Masaki Hirose, both of Tokyo; Yoshihisa Warashina, Hamamatsu; Mikio Kyomasu, Okaya, all of Japan

[73] Assignees: Hamamatsu Photonics K.K., Hamamatsu; Nippon Telegraph and Telephone Corporation, Tokyo, both of Japan

[21] Appl. No.: 09/034,366

[22] Filed: Mar. 4, 1998

[30] Foreign Application Priority Data

Mar. 4, 1997 [JP] Japan .................................. 9-048802
Mar. 4, 1997 [JP] Japan .................................. 9-048804

[51] Int. Cl.$^7$ ...................................................... G02B 6/36
[52] U.S. Cl. ............................................... 385/92; 385/93
[58] Field of Search .................................. 361/760, 783, 361/784, 803; 385/14, 88, 89, 90, 91, 92, 93, 94

[56] References Cited

U.S. PATENT DOCUMENTS 5,150,280  9/1992  Arai et al. ................................ 361/401
5,708,743  1/1998  DeAndrea et al. ....................... 385/88
5,737,467  4/1998  Kato et al. ................................ 385/92
5,940,562  8/1999  Henson et al. ........................... 385/88

FOREIGN PATENT DOCUMENTS

2-297511  12/1990  Japan .
3-140824  6/1991  Japan .

*Primary Examiner*—Hung N. Ngo
*Attorney, Agent, or Firm*—Pillsbury Madison & Sutro LLP

[57] ABSTRACT

A photodetector unit for a photodetector module for optical communication includes a photodetector circuit unit constituted by a ceramic board on which a photodiode for converting input light into an electrical signal and a preamplifier IC connected to the photodiode by bump bonding are mounted, and which has a photodetector circuit connected to the preamplifier IC by bump bonding, and a main amplification circuit unit constituted by a ceramic board on which a main amplification IC is mounted, and which has a main amplification circuit connected to the main amplification IC by bump bonding. The ceramic boards of the photodetector circuit unit and the main amplification circuit unit are mechanically and electrically connected to each other such that a mount surface of the preamplifier IC becomes perpendicular to a mount surface of the main amplification IC.

7 Claims, 6 Drawing Sheets

PHOTODETECTOR MODULE USING PHOTODETECTOR MODULE CIRCUIT BOARD ACCORDING TO EMBODIMENT OF PRESENT INVENTION (CROSS-SECTIONAL STRUCTURE)

ARRANGEMENT OF CERAMIC BOARD A FORMING
PHOTODETECTOR CIRCUIT CERAMIC BOARD 8

11 PREAMPLIFIER IC

9 PD

ARRANGEMENT OF CERAMIC BOARD B FORMING
PHOTODETECTOR CIRCUIT CERAMIC BOARD 8

ARRANGEMENT OF CERAMIC BOARD B FORMING
PHOTODETECTOR CIRCUIT CERAMIC BOARD 8

CONTACT SURFACE FOR MAIN
AMPLIFICATION CIRCUIT
CERAMIC BOARD 16

PROTRUDING PORTION OF
SEVERAL $\mu$m TO
SEVERAL TEN $\mu$m

Fig. 5 METHOD OF ASSEMBLING PHOTODETECTOR MODULE FOR OPTICAL COMMUNICATION ACCORDING TO PRESENT INVENTION

Fig.6

CROSS-SECTIONAL STRUCTURE OF CONVENTIONAL PHOTODETECTOR MODULE
FOR OPTICAL COMMUNICATION INCORPORATING FRONT-END CIRCUIT

LIGHT RECEIVING MODULE FOR OPTICAL COMMUNICATION AND LIGHT RECEIVING UNIT THEREOF

BACKGROUND OF THE INVENTION

1. Field of the Invention

The present invention relates to a photodetector module for optical communication incorporating a front-end circuit used as a photodetector for an ultra-high speed light transmitting system and a photodetector unit.

2. Related Background Art

A photodetector module for optical communication which photoelectrically converts a high-speed signal with a signal speed on the order of Gbits/s or more is required to minimize the parasitic impedances between elements to attain high-speed characteristics. A front-end circuit using bump bonding (flip chip bonding) can be effectively used for this purpose.

Figure 6:
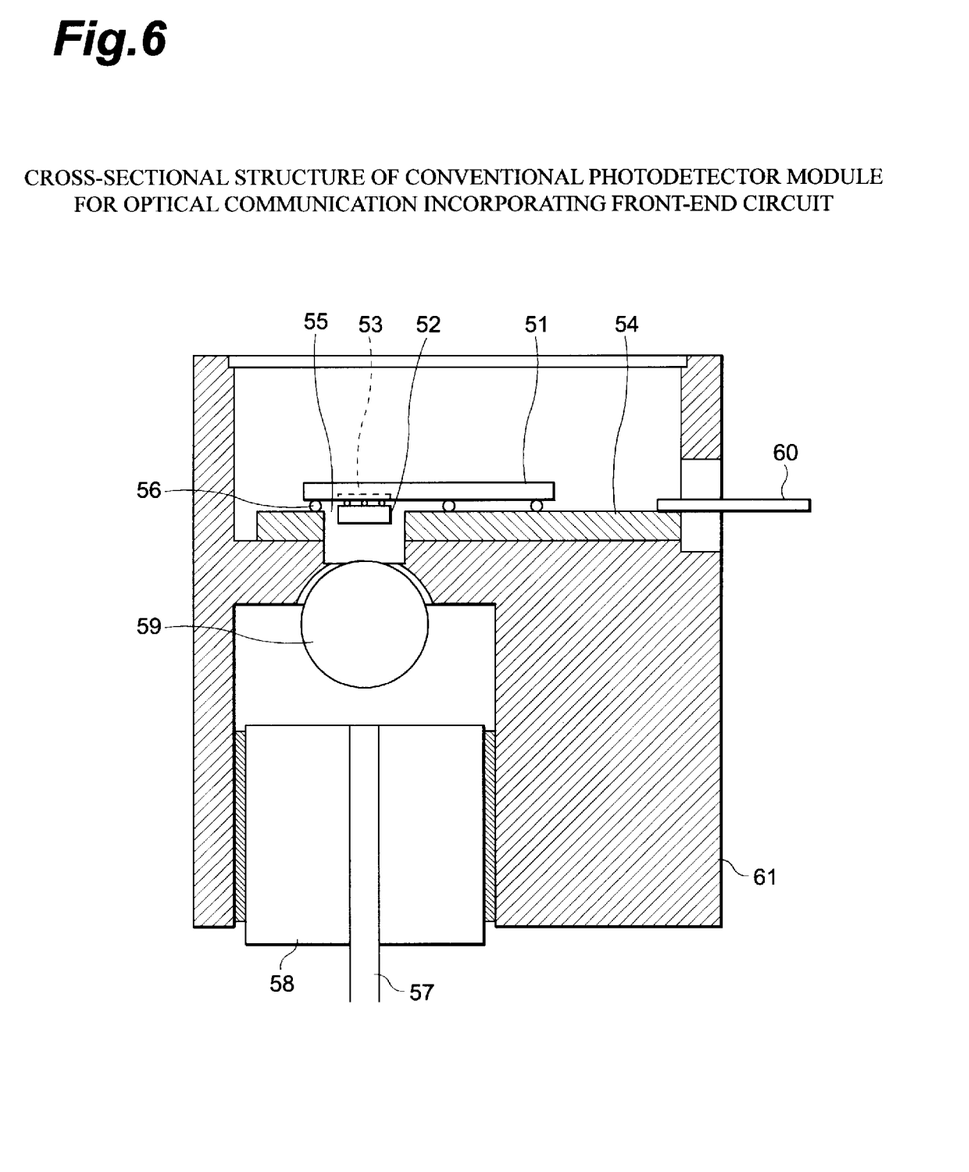
FIG. 6 is a sectional view showing the arrangement of a conventional photodetector module incorporating a front-end circuit.

The technique disclosed in Japanese Patent Laid-Open No. 2-297511 is known, in particular, as a photodetector module for optical communication incorporating such a front-end circuit. FIG. 6 is a sectional view showing the arrangement of this photodetector module for optical communication.

As shown in FIG. 6, a front-end circuit 51 is constituted by a photodiode 52 and an electronic circuit element 53 which are connected by bump bonding. The front-end circuit 51 is connected to a circuit board 54 through solder bumps 56 by bump bonding such that the photodiode (PD) 52 is inserted in a hole 55 in the circuit board 54. An optical fiber 57 is fixed with a fiber support part 58. An optical signal output from the optical fiber 57 is focused on the photodiode 52 through a spherical lens 59 and the hole 55. An electrical signal output from the photodiode 52 is output to the outside through the electronic circuit element 53, the solder bumps 56, the interconnections on the circuit board 54, and a high-frequency pin 60. The circuit board 54, the spherical lens 59, and the fiber support part 58 are supported on a base/optical coupling part holder 61.

This arrangement is characterized in that the front-end circuit 51 to which the photodiode 52 is connected by bump bonding is further connected to the circuit board 54 by bump bonding. Bump bonding can greatly reduce the parasitic impedance accompanying the above two connections as compared with wire bonding and other conventional bonding methods. Ultra-high-speed operation of about 10 Gbits/s can be realized.

SUMMARY OF THE INVENTION

The electronic circuit element 53 of the front-end circuit 51 is a preamplifier IC. A main amplification IC (e.g., a limiter amplification IC, an equalization amplification IC, or a variable-gain amplification IC), a retiming IC (e.g., an identification PLL IC or a speed conversion IC), and the like are connected to the subsequent stage (outside the module) of the electronic circuit element 53. The parasitic impedances at the interconnections on the circuit board 54, the high-frequency pin 60, and the main amplification IC side increase upon connection of the preamplifier IC up to the main amplification IC. This may make the operation unstable in ultra-high-speed region. If the main amplification IC is packaged, the parasitic impedances on the pins of the package, the board interconnections in the package, the wire bonding, and the like raise problems.

When the main amplification IC, the retiming IC, and the like are to be mounted in this photodetector module for optical communication, it is inevitable that they should be mounted on the circuit board 54. As a result, the base/optical coupling part holder 61 increases in size to increase the probability of optical axis misalignment due to thermal deformation and the like. In addition, although the number of pins increases with an increase in the number of chips to be mounted, this structure is not suited to a multi-chip structure and difficult to realize a reduction in size.

It is an object of the present invention to provide a photodetector module for optical communication which includes a preamplifier IC, a main amplification IC, a retiming IC, and the like in a module, realizes connections between the ICs while minimizing the parasitic impedances, has excellent ultra-high-speed characteristics, suffers little optical axis misalignment due to thermal deformation and the like, and can realize a reduction in size with a multi-pin structure, and a photodetector unit used for the module.

In order to achieve the above object, according to the present invention, there is provided a photodetector unit for a photodetector module for optical communication, comprising a photodetector circuit unit constituted by a ceramic board on which a photodiode for converting input light into an electrical signal and a preamplifier IC connected to the photodiode by bump bonding are mounted, and which has a photodetector circuit connected to the preamplifier IC by bump bonding, and a main amplification circuit unit constituted by a ceramic board on which a main amplification IC is mounted, and which has a main amplification circuit connected to the main amplification IC by bump bonding, wherein the ceramic boards of the photodetector circuit unit and the main amplification circuit unit are mechanically and electrically connected to each other such that a mount surface of the preamplifier IC becomes perpendicular to a mount surface of the main amplification IC.

According to this arrangement, the photodetector circuit unit has the minimum circuit arrangement, and hence can be reduced in size. Since the main amplification circuit, in particular, is separately arranged, the influences of thermal deformation and the like due to heat can be reduced. In addition, since the main amplification circuit and the photodetector circuit can be connected at a short distance, parasitic impedances and the like can be reduced.

Preferably, a photodiode or an interconnection pattern for connecting a photodiode to an electric circuit is formed on a first surface of the ceramic board of the photodetector circuit unit, a ground electrode is formed on a second surface opposing the first surface, an interconnection pattern connected to the main amplification circuit is formed on a third surface perpendicular to the first and second surfaces, and a board thickness corresponding to a distance between the first and second surfaces is set to a thickness that ensures impedance matching with the main amplification circuit.

With this arrangement, the above photodetector circuit unit can be easily manufactured.

According to the present invention, there is provided a photodetector module for optical communication comprising this photodetector unit, a ceramic board constituted by a retiming circuit unit on which a retiming IC is mounted, and which has a retiming circuit connected to the retiming IC by die bonding and wire bonding and also connected to the main amplification circuit through flexible wiring means, the retiming circuit unit being physically isolated from the photodetector unit, and a receptacle unit having a sleeve and a metal lens holder integrally formed in a resin case, and having a lens and a fiber stub inserted into the metal lens holder, the metal lens holder being fixed to the photodetector unit.

According to this arrangement, since the photodetector unit and the receptacle unit are fixed, optical axis misalignment can be prevented. In addition, since the identification circuit timing unit and the photodetector unit are physically isolated from each other, even if the receptacle unit moves, the photodetector unit can freely move following the movement of the receptacle unit to some extent. This prevents optical axis misalignment.

The present invention can be fully understood by the following detailed description and the accompanying drawings. It is to be understood that these examples are considered as exemplary only, and do not limit the present invention.

Further applications of the present invention will be apparent from the following detailed description of the present invention. Apparently, although the following detailed description and specific cases explain the preferred embodiments of the present invention, they are only exemplary, and various modifications and improvements within the spirit and scope of the invention are apparent to those skilled in the art from this detailed description of the present invention.

BRIEF DESCRIPTION OF THE DRAWINGS

FIGS. 2A to 2C are views showing the arrangement of a ceramic board A forming a photodetector circuit ceramic board in the photodetector module for optical communication in FIG. 1, in which

FIGS. 3A and 3B are views showing the arrangement of a ceramic board B forming the photodetector circuit ceramic board 8, in which

FIGS. 4A and 4B are views showing the arrangement of the photodetector circuit ceramic board 8, in which

DESCRIPTION OF THE PREFERRED EMBODIMENT

A preferred embodiment of the present invention will be described below with reference to the accompanying drawings. To facilitate the comprehension of the explanation, the same reference numerals denote the same parts, where possible, throughout the drawings, and a repeated explanation will be omitted. Note that the shapes and sizes of some of the constituent elements in the drawings are emphasized for the sake of descriptive convenience, and do not necessarily coincide with the actual shapes and sizes.

Figure 1:
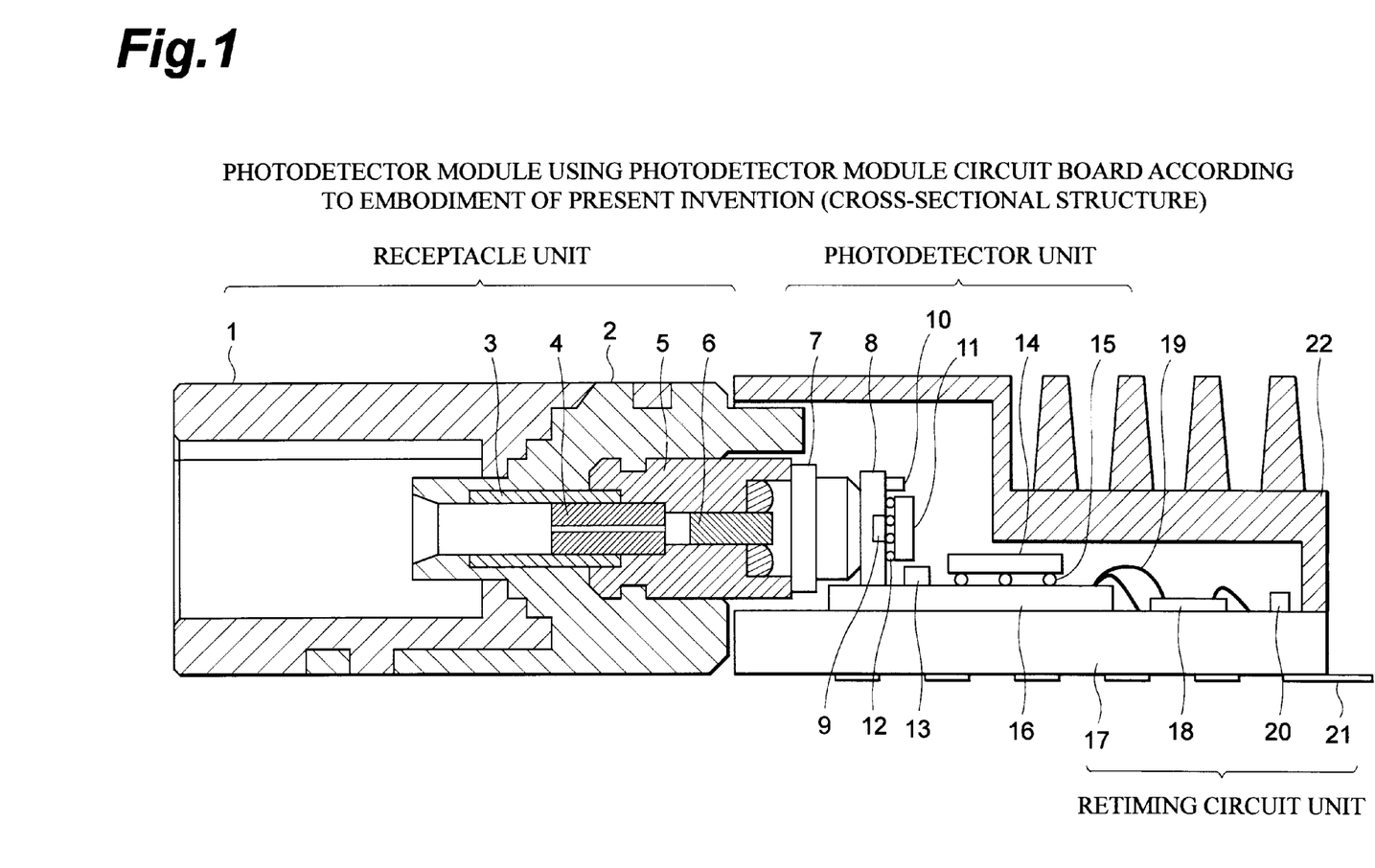
FIG. 1 is a sectional view showing the arrangement of a photodetector module for optical communication according to an embodiment of the present invention.

FIG. 1 is a sectional view showing the arrangement of a photodetector module for optical communication according to a preferred embodiment of the present invention.

As shown in FIG. 1, this photodetector module is roughly divided into a receptacle unit constituted by an optical system for guiding light to a photodetector element, a photodetector unit including a circuit system for receiving an optical signal, converting it into an electrical signal, and outputting the signal, and a retiming circuit unit for driving the photodetector unit system. Of these units, the receptacle unit is constituted by an adaptor 1 for protecting a connecting portion for an optical fiber for communication, a resin case 2, a sleeve 3 for holding a ferrule on which the optical fiber for communication is fixed, a fiber stub 4 optically coupled to the optical fiber for communication, a metal lens holder 5 for holding an optical axis, and a lens 6 for guiding light to the photodetector unit. The photodetector unit is constituted by an optical path adjusting quartz plate 7 for light coming from the receptacle unit, a photodetector circuit ceramic board 8, a PD 9 for converting optical signal into an electrical signal, a passive element 10 for driving the photodetector element, a preamplifier IC 11, bumps 12 (the unit constituted by these components will be referred to as a "photodetector circuit unit"), a passive element 13, a main amplification IC 14, bumps 15, and a main amplification circuit ceramic board 16 (the unit constituted by these components will be referred to as a "main amplification circuit unit" hereinafter). The retiming circuit unit is constituted by a retiming circuit ceramic board 17, a retiming IC 18, a wires 19, a passive element 20, a lead 21. A receptacle photodetector unit is made up of this receptacle unit and the photodetector unit.

A photodetector module for optical communication is constituted by this unit, the retiming circuit unit, and an outer case 22.

The arrangement of the photodetector unit will be described in more detail below. The PD 9 of the back-side illuminated type is connected to the preamplifier IC 11 by bump bonding. The preamplifier IC 11 is connected to the photodetector circuit ceramic board 8 by bump bonding. In addition, the main amplification IC 14 is connected to the main amplification circuit ceramic board 16 by bump bonding.

The photodetector circuit ceramic board 8 and the main amplification circuit ceramic board 16 are soldered to each other such that the mount surfaces of the preamplifier IC 11 and the main amplification IC 14 become perpendicular to each other. The preamplifier IC 11, the main amplification IC 14, and the passive elements 10 and 13 are connected to each other on the two boards through impedance-controlled short transmission lines. With this structure, ultra-high-speed operation can be performed.

The main amplification IC 14 and the retiming IC 18 are connected to each other by wire bonding. Since relatively large signal amplitudes are set between these components, wire bonding has no significant influence on ultra-high-speed operation as long as the bonding length stays around 2 mm or less. Of the three ICs shown in FIG. 1, the retiming IC 18 consumes power most, and must be mounted on the board so as to face up in consideration of heat dissipation. For this reason, the retiming IC 18 is placed as shown in FIG. 1. Note that since the main amplification circuit ceramic board 16 and the retiming circuit ceramic board 17 are not fixed and relatively movable even though they are in contact with each other, deformation of the retiming IC 18 and the like due to heat has no influence on the main amplification circuit ceramic board 16 and the photodetector circuit ceramic board 8.

The retiming circuit ceramic board 17 and the receptacle unit are coupled to each other with a portion of the resin case 2. The photodetector unit constituted by the photodetector circuit ceramic board 8 and the main amplification circuit ceramic board 16 and the receptacle unit are joined to each other with a portion of the metal lens holder 5. Although not clearly illustrated in FIG. 1 because it is a sectional view, the sleeve 3, the fiber stub 4, the metal lens holder 5, and the lens 6 have cylindrical structures to minimize deformations with respect to the center due to thermal expansion. Even if, therefore, the heat generated by the retiming circuit ceramic board 17 is transferred to the receptacle unit to cause the resin portion to thermally expand, the metal lens holder 5 and the like do not deform, and the photodetector circuit ceramic board 8 is not influenced by the thermal expansion.

Consequently, no optical axis misalignment occurs.

In addition, according to the arrangement of this embodiment, a multi-pin structure can be easily realized by mounting pins on the retiming circuit ceramic board 17 in three directions other than the direction in which it is in contact with the receptacle unit, as in the case of a flat package.

The photodetector circuit ceramic board 8 as a characteristic feature of the present invention will be described below.

The dimensional precision limit of the optical path adjusting quartz plate 7 and the photodetector circuit ceramic board 8 with respect to the resin case 2 is about ±200 $\mu$m from the adjustment range for alignment. Since a precision of ±150 $\mu$m is required owing to optical axis misalignment associated with the performance of the lens 6 mounted on the resin case 2 (metal lens holder 5), the photodetector circuit ceramic board 8 must be formed with a precision of ±50 $\mu$m or less. A ceramic board is manufactured with an error of about ±150 $\mu$m by a conventional manufacturing method. To improve the precision, the dimensions must be corrected by polishing. With the structure of the photodetector circuit ceramic board 8 according to the present invention, such a precision can be easily attained.

Figures 2A, 2B:
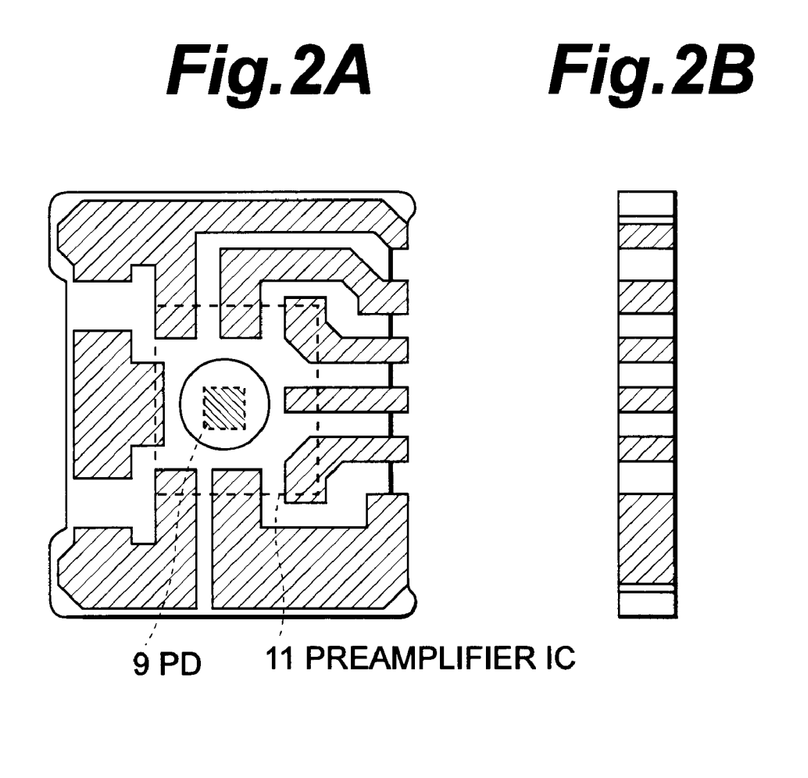
FIG. 2A is a front view of the arrangement.
FIG. 2B is a side view of the arrangement.
Figure 2C:
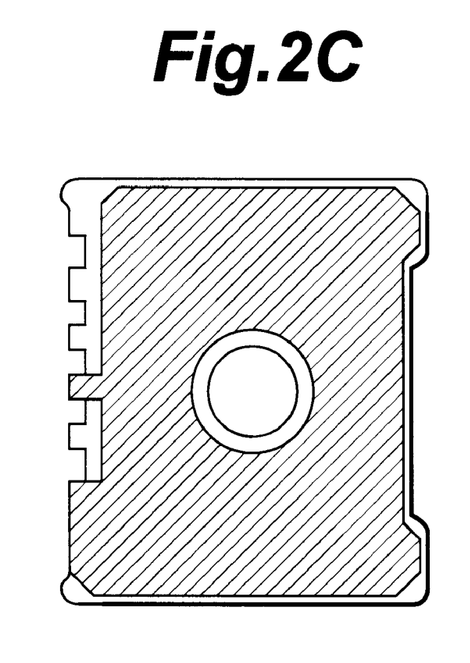
FIG. 2C is a rear view of the arrangement.
Figure 3A:
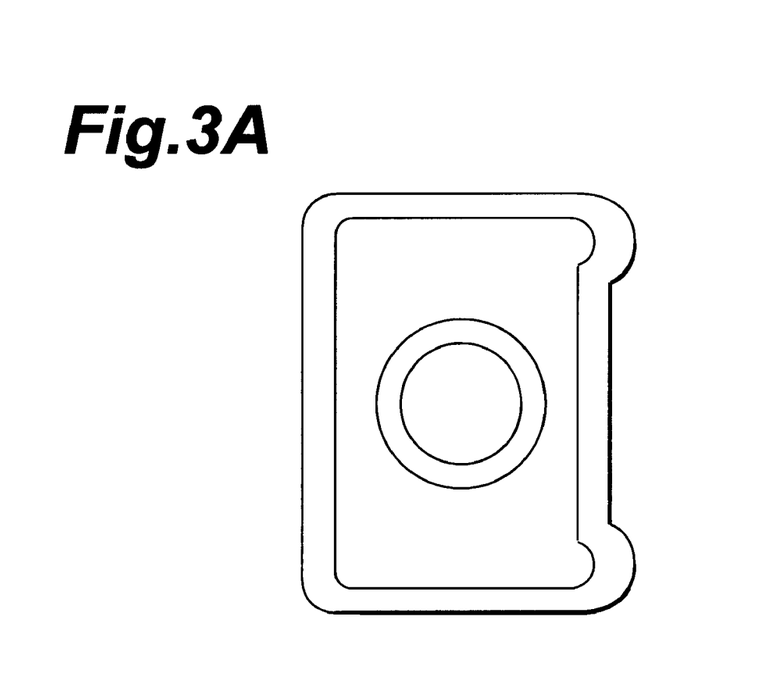
FIG. 3A is a plan view of the arrangement.
Figure 3B:
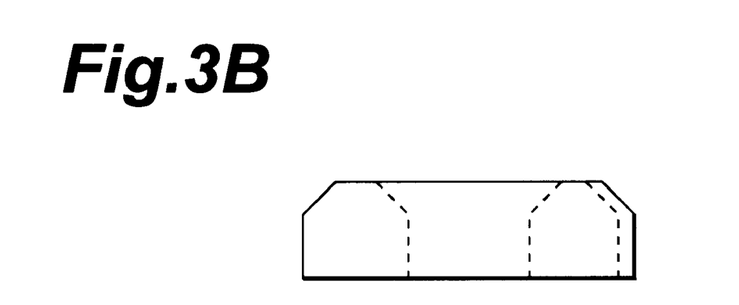
FIG. 3B is a side view of the arrangement.
Figure 4A:
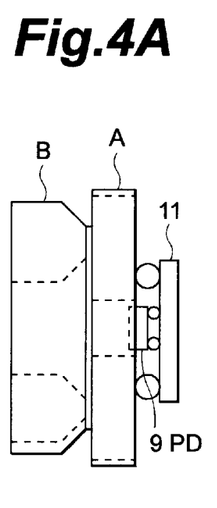
FIG. 4A is a side view of the arrangement.
Figure 4B:
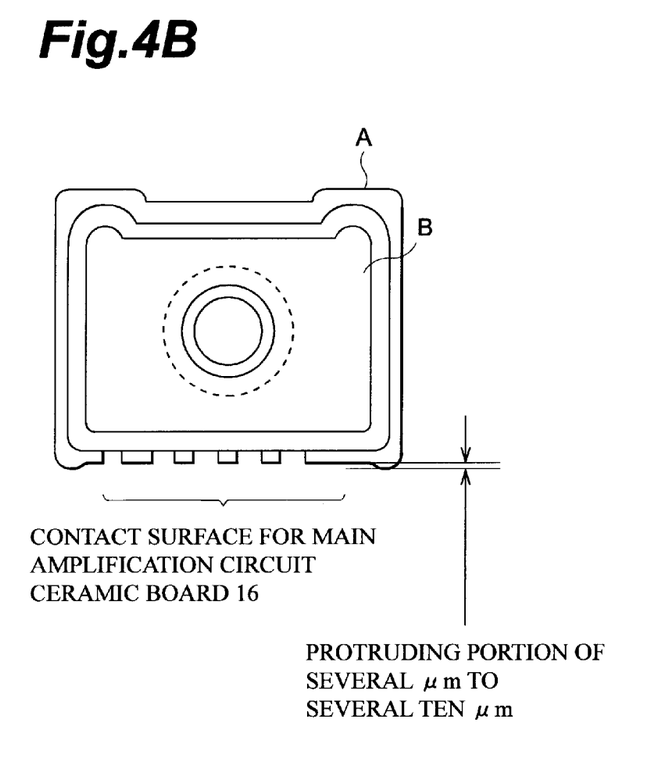
FIG. 4B is a front view of the arrangement.

The photodetector circuit ceramic board 8 is formed by joining a ceramic board A in FIGS. 2A to 2C to a ceramic board B in FIGS. 3A and 3B. FIGS. 4A and 4B show a state in which the ceramic board A and the ceramic board B are joined to each other with an adhesive. The reason why the photodetector circuit ceramic board 8 is divided into the ceramic boards A and B will be described below.

The hatched portions in FIGS. 2A to 2C indicate the metallization of the ceramic board A. FIG. 2A shows the surface to which the preamplifier IC 11 is connected by bump bonding. FIG. 2B shows the bottom portion of the ceramic board A which is connected to the main amplification circuit ceramic board 16. FIG. 2C shows the surface joined to the ceramic board B.

The ceramic board A and the main amplification circuit ceramic board 16 are electrically and mechanically connected to each other through the metallization formed on the bottom portion of the ceramic board A. As a signal interconnection pattern for this connection, micro-strip lines having undergone impedance matching must be formed.

The width of the signal interconnection pattern on the main amplification circuit ceramic board 16 is uniquely determined by the thicknesses of the interconnection pattern surface and the ground pattern surface, their dielectric constants, and the target impedance. To perform impedance matching, the width of the signal interconnection pattern on the ceramic board A must be made equal to the width of the signal interconnection pattern on the main amplification circuit ceramic board 16. However, since the dielectric constant of the ceramic board A is determined, the thickness of the ground pattern surface on the ceramic board A must be adjusted for impedance matching. On the other hand, the PD 9 must be placed at the focal position determined by optical design. In order to perform optical path length adjustment for the PD 9, the ceramic board B is joined to the ceramic board A to ensure a predetermined thickness.

The holes formed in the ceramic boards A and B shown in FIGS. 2A, C, and 3A pass light coming from the fiber to send it onto the PD 9 of the back-side illuminated type through the receptacle unit. In addition, a stepped trench is formed in the bottom portion of the ceramic board A and metallization is inlaid by a thick film printing technique.

In this case, metallization is done on the convex portions, but not on the concave portions. Therefore, the positions of the ceramic board A and the metallization can be self-aligned with an absolute precision. By forming the ceramic board A using a powder molding technique, it can be made with a high precision of about ±10 $\mu$m. The metallization can therefore be formed with a similar precision.

The two ends of the bottom portion of the ceramic board A to which the main amplification circuit ceramic board 16 is connected protrude by several $\mu$m to several ten $\mu$m so as to absorb the thickness of a conductive resin or solder used to connect them, as shown in FIG. 4. These protruding portions are important in eliminating variations in dimensional precision at the connecting portions between the two boards. If the thickness of a conductive resin or solder becomes uneven, the ceramic board A and the main amplification circuit ceramic board 16 may be connected to each other with a tilt, although it depends on the precision of a connection jig used to connect the boards. When wiring is to be performed between the main amplification circuit ceramic board 16 and the retiming circuit ceramic board 17, as shown in FIG. 1, the entire bottom surface of the main amplification circuit ceramic board 16 must be brought into contact with the retiming circuit ceramic board 17. In this case, therefore, the dimensional precision after the ceramic board A and the main amplification circuit ceramic board 16 are connected to each other is important. The protruding portions on the two ends of the bottom portion of the ceramic board A can serve to position and form the gap that absorbs the thickness of a conductive resin or solder. This makes the dimensional precision after connection dependent on only the dimensional precision of each ceramic board, thereby facilitating design of portions which demand mechanical and electric connection to circuits on the subsequent stages.

A method of assembling the photodetector module for optical communication according to this embodiment will be described below with reference to FIGS. 1 to 5.

The assembly procedure is: (1) assembly of a receptacle unit; (2) assembly of a photodetector circuit unit; (3) assembly of a main amplification circuit unit; (4) assembly of a photodetector unit; (5) alignment and assembly of a receptacle photodetector unit; (6) assembly of a retiming circuit unit; and (7) assembly of a photodetector module for optical communication. With this procedure, assembly including an alignment process can be performed. This procedure is suited for automation. Each assembly process will be described below.

(1) Assembly of Receptacle Unit (1-1) The sleeve 3 and the metal lens holder 5 are integrally assembled into a sleeve unit.

(1-2) The resin case 2 is formed in the sleeve unit by insert molding to assemble a sleeve unit with a case.

(1-3) The adaptor 1 is formed.

(1-4) The adaptor 1 is coupled to the sleeve unit with the case.

(1-5) The fiber stub 4 and the lens 6 are mounted in the metal lens holder 5 to assemble a receptacle unit.

Figure 5:
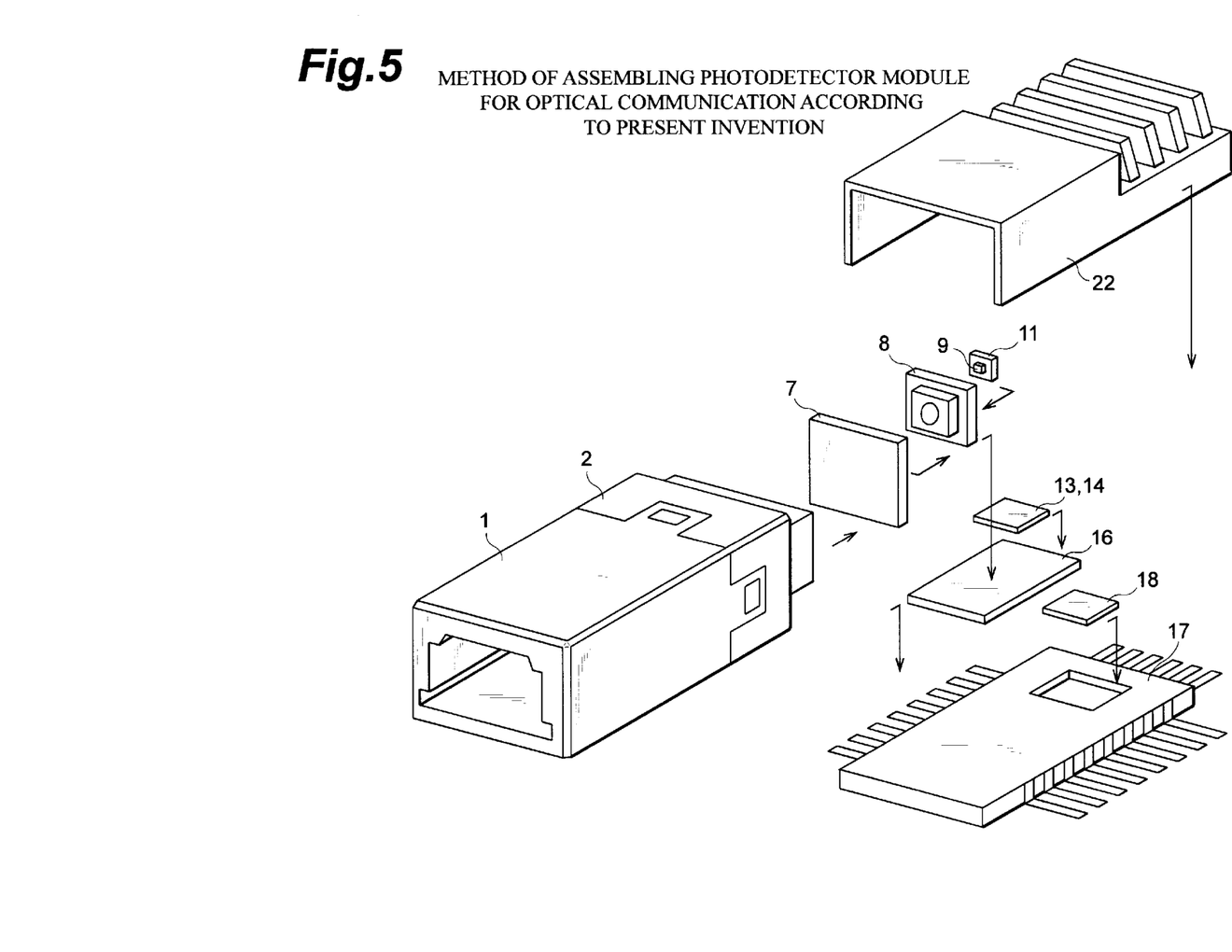
FIG. 5 is an exploded view for explaining a method of assembling the photodetector module for optical communication in FIG. 1.

(2) Assembly of Photodetector Unit (①  in FIG. 5)

(2-1) The PD 9 is connected to the preamplifier IC 11 by bump bonding to assemble a preamplifier IC with a PD.

(2-2) The passive element 10 such as a capacitor is surface-mounted on the photodetector circuit ceramic board 8.

(2-3) The preamplifier IC with the PD is connected to the mount board by bump bonding to assemble a photodetector circuit unit.

(3) Assembly of Main Amplification Circuit Unit (② in FIG. 5)

(3-1) The passive element 13 such as a capacitor is surface-mounted on the main amplification circuit ceramic board 16.

(3-2) The main amplification IC 14 is connected to the mount board by bump bonding to assemble a main amplification circuit unit.

(4) Assembly of Photodetector Circuit Unit (4-1) The photodetector circuit ceramic board 8 of the photodetector circuit unit is soldered to the main amplification circuit ceramic board 16 of the main amplification circuit unit (③ in FIG. 5).

(4-2) The optical path adjusting quartz plate 7 is mounted on the photodetector circuit ceramic board 8 to assemble a photodetector unit (④ in FIG. 5). The retiming circuit ceramic board 17 is not included in this photodetector unit to thermally isolate them from each other.

In addition, the size of the photodetector unit is minimized to facilitate handling of the unit in the next alignment process.

(5) Alignment and Assembly of Receptacle Photodetector Unit (5-1) The receptacle unit is mounted on an alignment unit having an x-y stage. The photodetector unit is mounted on an alignment unit having a z stage. An optimal position is then detected by monitoring a photoelectric signal from a monitor terminal incorporated in the photodetector unit.

(5-2) The metal lens holder 5 of the receptacle unit and the optical path adjusting quartz plate 7 of the photodetector unit are bonded to each other at the optimal position with an ultraviolet curing adhesive or quick-drying adhesive to assemble a receptacle photodetector unit (⑤ in FIG. 5). With the use of the adhesive, any mechanical precision deviation produced in the alignment process can be absorbed by the thickness of the adhesive.

(6) Assembly of Retiming Circuit Unit (6-1) The passive element 20 such as a capacitor is surface-mounted on the retiming circuit ceramic board 17.

(6-2) The retiming IC 18 is fixed to the mount board by die bonding to assemble the retiming circuit unit (⑥ in FIG. 5).

(7) Assembly of Photodetector Module for Optical Communication (7-1) The retiming circuit unit is mounted on the receptacle photodetector unit.

(7-2) The retiming IC 18 was wire-bonded to the retiming circuit ceramic board 17, and the retiming IC 18 to and the main amplification circuit ceramic board 16 (⑦ in FIG. 5).

(7-3) The outer case 22 is mounted on the resultant structure to assemble a photodetector module for optical communication (⑧ in FIG. 5).

According to the photodetector module formed in this manner, the PD, the preamplifier IC, the main amplification IC, and the retiming IC can be mounted in the module to realize a compact, ultra-high-speed module. In addition, the structure of this module is designed to prevent optical axis misalignment due to thermal deformation and the like, and can flexibly cope with an increase in the number of pins.

Furthermore, the assembly method is suited for automation, and hence a reduction in cost can be attained by mass production. Therefore, the performance/function, quality, and reliability of a photodetector module for optical communication can be improved.

Although the above description has exemplified the receptacle type optical system unit, a pigtail type optical system unit can also be used in the same manner.

As is obvious from the above description, the present invention can be variously modified. It is to be understood that such modifications fall within the spirit and scope of the invention, and any improvements obvious to those skilled in the art are incorporated in the appended claims.

What is claimed is:

1. A photodetector unit for a photodetector module for optical communication, comprising:

a photodetector circuit unit constituted by a ceramic board on which a photodiode for converting input light into an electrical signal and a preamplifier IC connected to said photodiode by bump bonding are mounted, and which has a photodetector circuit connected to said preamplifier IC by bump bonding; and a main amplification circuit unit constituted by a ceramic board on which a main amplification IC is mounted, and which has a main amplification circuit connected to said main amplification IC by bump bonding, wherein said ceramic boards of said photodetector circuit unit and said main amplification circuit unit are mechanically and electrically connected to each other such that a mount surface of said preamplifier IC becomes perpendicular to a mount surface of said main amplification IC.

2. A unit according to claim 1, wherein said ceramic boards of said photodetector circuit unit and said main amplification circuit unit are connected to each other with a conductive resin or solder.

3. A unit according to claim 1, wherein a photodiode or an interconnection pattern for connecting a photodiode to an electric circuit is formed on a first surface of said ceramic board of said photodetector circuit unit, a ground electrode is formed on a second surface opposing the first surface, an interconnection pattern connected to said main amplification circuit is formed on a third surface perpendicular to the first and second surfaces, and a board thickness corresponding to a distance between the first and second surfaces is set to a thickness that ensures impedance matching with said main amplification circuit.

4. A unit according to claim 3, wherein the interconnection pattern on the third surface is constituted by an uneven pattern formed by metallizing a protruding surface, and two end portions of the third surface protrude from a top surface of the interconnection pattern.

5. A photodetector module for optical communication comprising:

said photodetector unit according to claim 1;

a retiming circuit unit constituted by a ceramic board on which a retiming IC is mounted, and which has a retiming circuit connected to said identification timing IC by die bonding and wire bonding and also connected to said main amplification circuit through flexible wiring means, said identification timing circuit unit being mechanically isolated from said photodetector unit; and a receptacle unit having a sleeve and a metal lens holder are integrally formed in a resin case, and having a lens and a fiber stub inserted into said metal lens holder, said metal lens holder being fixed to said photodetector unit.

6. A module according to claim 5, further comprising a sub-board mounted on said ceramic board of said photodetector circuit unit on a photodetector surface side of said photodiode and having a thickness that adjusts an optical path length of light that becomes incident on said photodiode.

7. A module according to claim 5, wherein a plurality of pins are arranged on said ceramic board of said identification timing circuit unit in the form of a flat package.

* * * * *